(12) United States Patent
Jauregui

(10) Patent No.: US 6,879,491 B2
(45) Date of Patent: Apr. 12, 2005

(54) GATE DRIVER MULTI-CHIP MODULE

(75) Inventor: David Jauregui, Downey, CA (US)

(73) Assignee: International Rectifier Corporation, El Segundo, CA (US)

( * ) Notice: Subject to any disclaimer, the term of this patent is extended or adjusted under 35 U.S.C. 154(b) by 226 days.

(21) Appl. No.: 10/252,988

(22) Filed: Sep. 23, 2002

(65) Prior Publication Data

US 2003/0016505 A1 Jan. 23, 2003

Related U.S. Application Data

(63) Continuation of application No. 09/813,011, filed on Mar. 21, 2001, now abandoned.
(60) Provisional application No. 60/191,125, filed on Mar. 22, 2000.

(51) Int. Cl.$^7$ .................................................. H05K 7/00
(52) U.S. Cl. ....................... 361/728; 361/794; 361/760; 361/720
(58) Field of Search ................................. 361/728, 760, 361/720, 746, 748, 821, 794; 323/920; 315/307, 209

(56) References Cited

U.S. PATENT DOCUMENTS

| | | | |
|---|---|---|---|
| 4,967,332 A | 10/1990 | Claydon et al. | 363/17 |
| 5,384,691 A | 1/1995 | Neugebauer | 361/794 |
| 5,629,563 A | 5/1997 | Takiar et al. | 257/723 |
| 5,642,262 A | 6/1997 | Terill et al. | 361/783 |
| 5,747,982 A | 5/1998 | Dromgoole et al. | 323/902 |
| 6,002,213 A | 12/1999 | Wood | 315/307 |
| 6,031,338 A | 2/2000 | Yoon et al. | 315/209 R |
| 6,058,012 A | 5/2000 | Cooper et al. | 361/704 |
| 6,137,167 A | 10/2000 | Ahn et al. | 257/691 |
| 2002/0163322 A1 * | 11/2002 | Saxelby et al. | |

* cited by examiner

Primary Examiner—Kamand Cuneo
Assistant Examiner—Hung S. Bui
(74) Attorney, Agent, or Firm—Ostrolenk, Faber, Gerb & Soffen, LLP

(57) ABSTRACT

A multi-chip module (MCM) provides power circuitry on a computer motherboard in a package of reduced size without sacrificing performance. The MCM co-packages essential power circuit components on a ball grid array (BGA) substrate. Two power MOSFETs disposed on the BGA substrate are connected in a half-bridge arrangement between an input voltage and ground. A MOSFET gate driver is electrically connected to respective gate inputs of the two power MOSFETs for alternately switching the power MOSFETs to generate an alternating output voltage at a common output node between the power MOSFETs. At least one Schottky diode is disposed on the BGA substrate and connected between the common output node and ground to minimize losses during deadtime conduction periods. The input capacitor of the circuit is contained within the MCM housing and is located close to the MOSFETs, reducing stray inductance in the circuit. The MCM package is thin and has dimensions of about 1 cm by 1 cm or less.

13 Claims, 4 Drawing Sheets

GATE DRIVER MULTI-CHIP MODULE

CROSS REFERENCE TO RELATED APPLICATIONS

This is a continuation of U.S. patent application Ser. No. 09/813,011, filed Mar. 21, 2001 abandoned, which is based upon and claims priority of U.S. Provisional Application Ser. No. 60/191,125, filed Mar. 22, 2000.

BACKGROUND OF THE INVENTION

1. Field of the Invention

The present invention relates to a multi-chip module (MCM). More specifically, the present invention relates to an MCM power circuit for a computer motherboard.

2. Description of the Related Art

Power supply circuitry typically occupies a substantial area on a computer motherboard. It would be desirable to reduce the size of the power circuitry on a computer motherboard without sacrificing performance.

SUMMARY OF THE INVENTION

The present invention provides an MCM which includes a MOSFET gate driver, two power MOSFETs, and associated passive elements including an input capacitor all mounted on a ball grid array (BGA) substrate and packaged in a single chip.

The power MOSFETs of the MCM of the present invention are connected in a half-bridge arrangement between an input voltage and ground. The MOSFET gate driver is connected to respective gate inputs of the two power MOSFETs, and alternately switches the power MOSFETs to generate an alternating output voltage at a common output node between the power MOSFETs. At least one Schottky diode is disposed on the BGA substrate and connected between a common output node and ground to minimize losses during deadtime conduction periods.

The passive circuit components include an input capacitor connected between the input voltage and ground which provides input capacitance for the converter. Advantageously, the input capacitor is physically close to all other components. Additional components provide appropriate biasing for the gate driver. All components are encased in a molding compound to form the MCM package.

By mounting the input capacitor very close to other components and within the very small package, a number of advantages are realized, as follows:

First, there is a very low stray inductance between the input capacitor and the MOSFETs which reduces the "ring" that would be caused in the circuit including the MOSFET parasitic capacitance $C_{OSS}$ and the stray inductance L. Reducing the inductance reduces the circuit ring.

Second, the location of the input capacitor within the MCM package provides layout independence for the mother board, which no longer needs to contain that capacitor (at a distance from the MOSFETs in the MCM package).

Third, the capacitor acts as a bypass to conduction of unintended current (with a high di/dt) through the body diode of one of the MOSFETs in the package and acts to help clamp the $Q_{RR}$ (reverse recovery charge) of the MOSFET.

The module preferably is enclosed in a package that has side dimensions of about 11 mm×11 mm (i.e., about 1 cm×1 cm) or less. Accordingly, the input capacitor is located less than 1 cm from the MOSFET.

The MCM of the present invention advantageously results in a 50% reduction in size with no performance trade off and is printed circuit board (PCB) independent. The package advantageously provides a performance increase over the discrete solution.

Other features and advantages of the present invention will become apparent from the following description of the invention which refers to the accompanying drawings.

DETAILED DESCRIPTION OF THE PREFERRED EMBODIMENTS

Figure 1:
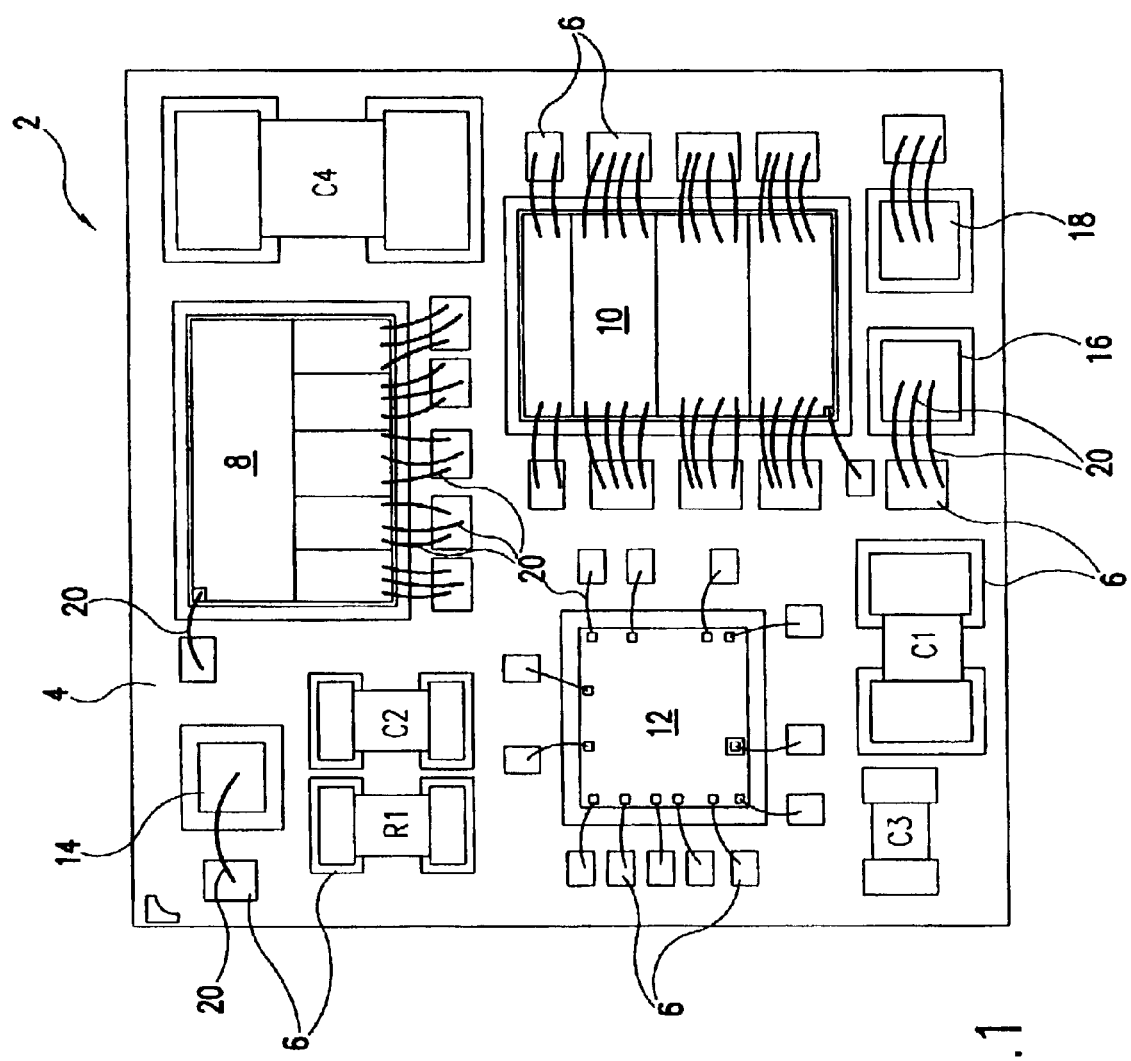
FIG. 1 is a plan view drawing of the co-packaged active and passive components in the MCM of the present invention.

Referring to FIG. 1, a diagram of a preferred layout for MCM 2 of the present invention is shown. MCM 2 includes six die mounted on a BGA substrate 4. A plurality of bonding pads 6 are disposed on the upper surface of substrate 4.

Die 8 and 10 are power MOSFETs, preferably IRFC7811A and IRFC7809A power MOSFETs, respectively, mounted in a half-bridge configuration. Die 12 is a MOSFET gate driver, preferably a Semtech SC1405 High Speed Synchronous Power MOSFET Smart Driver. Die 14, 16, and 18 are Schottky diodes, preferably SKM863 diodes, connected as shown in the circuit schematic of FIG. 3. The active components mounted on the upper surface of substrate 4 are connected electrically to corresponding bonding pads 6 using wire bonds 20.

Figure 3:
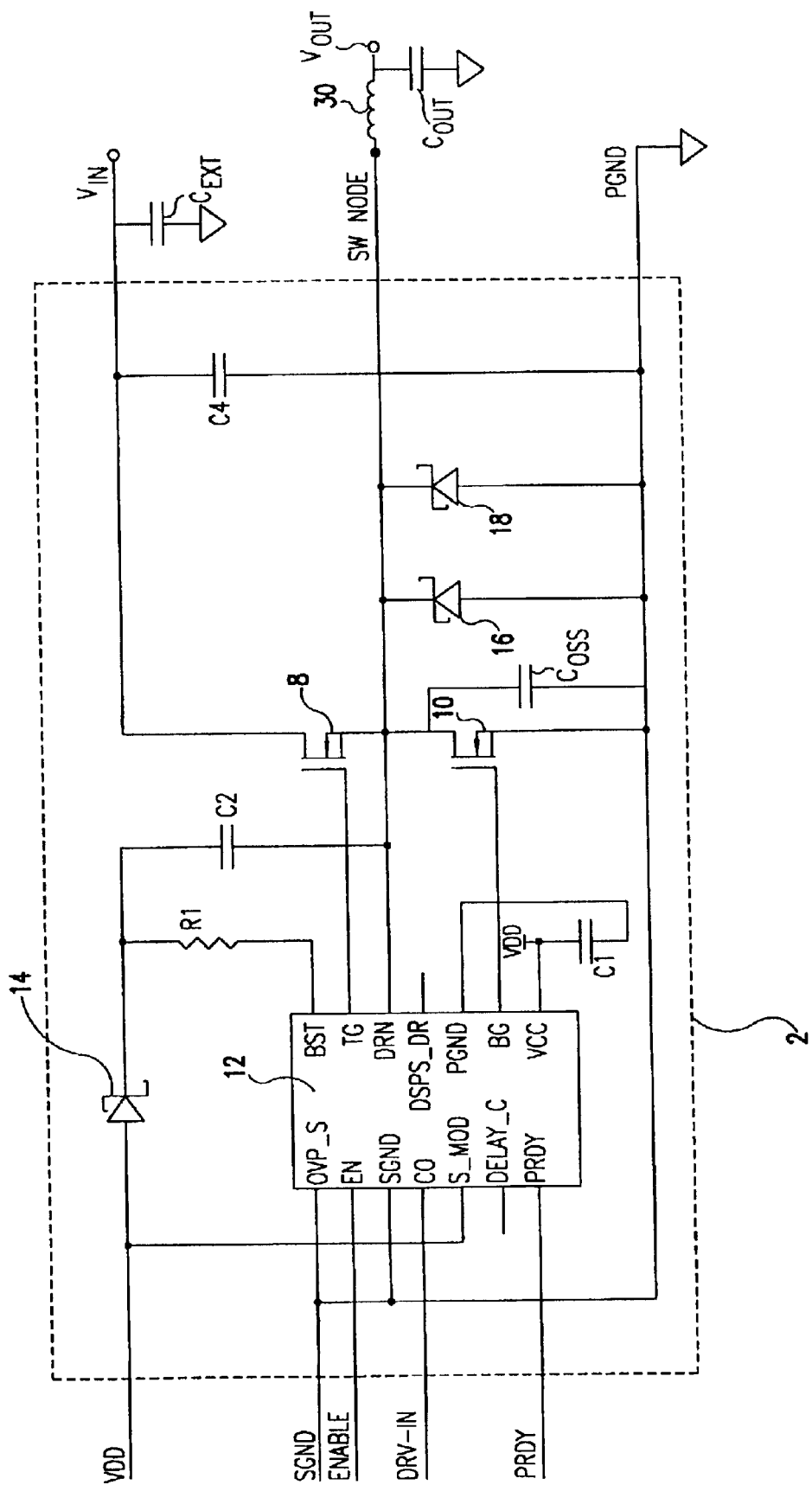
FIG. 3 is a circuit schematic of an MCM according to the present invention.

The passive components shown in FIG. 1 include resistor R1, and capacitors C1, C2, C3, and C4, also connected as shown in the circuit schematic of FIG. 3. The passive components are shown bonded directly to corresponding pads 6. Significantly, capacitor C4 is mounted close to MOSFETs 8 and 10.

Figure 2:
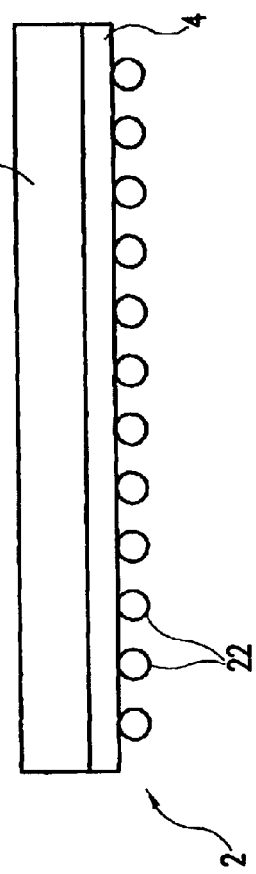
FIG. 2 is an elevation view drawing of an MCM according to the present invention.

Referring to FIG. 2, MCM 2 of the present invention is shown in elevation. A plurality of solder balls 22 are arranged on the lower surface of substrate 4. In the finished package, the components on the upper surface of substrate 4 are encapsulated in a mold compound 24 such as Nitto HC 100. The dimension of housing 2 is about 1 cm×1 cm so it will take very little space on a mother board.

Referring to FIG. 3, a circuit schematic of power supply MCM 2 is shown. Power MOSFETs 8 and 10 are mounted in a half-bridge configuration, connected in series between an input voltage $V_{IN}$ and ground $P_{GND}$. External circuit capacitance $C_{EXT}$ is connected to $V_{IN}$. A high-side output gate drive TG of MOSFET gate driver 12 is connected to a gate input 20 of high-side power MOSFET 8. A low-side output gate drive BG of MOSFET gate driver 12 is connected to a gate input 22 of low-side power MOSFET 10. Gate driver 12 alternately switches the power MOSFETs to generate an alternating output voltage at a common output node SW NODE between the power MOSFETs.

Schottky diodes 16 and 18 are connected between common output node SW NODE and ground to minimize losses during dead time conduction periods. An input capacitor C4 is connected between the input voltage $V_{IN}$ and ground $P_{GND}$. The use of two parallel diodes 16 and 18 helps in keeping a symmetrical layout of components. An output inductor 30 generally will be connected to the SW NODE and to the output voltage terminal $V_{OUT}$. An output capacitor $C_{OUT}$ is also in the output circuit.

A supply voltage $V_{DD}$ is provided to MOSFET gate driver 12 on pin $V_{CC}$. A bootstrap circuit, consisting of Schottky diode 14, and resistor R1/capacitor C2 connected between the bootstrap pin BST and the DRN pin, is provided to develop a floating bootstrap voltage for high-side MOSFET 8.

A TTL-level input signal is provided on line DRV_IN to MOSFET driver pin CO. Operation of the device is enabled by providing a minimum of 2.0 volts on enable pin EN of MOSFET driver 12. Status pin $P_{RDY}$ indicates the status of the +5V supply voltage. When the supply voltage is less than 4.4V, this output is driven low. When the supply voltage is greater than 4.4V, this output is driven high. This output has a 10 mA source and 10 μA capability. When $P_{RDY}$ is low, undervoltage circuitry built into driver 12 guarantees that both driver outputs TG and BG are low.

Figure 4:
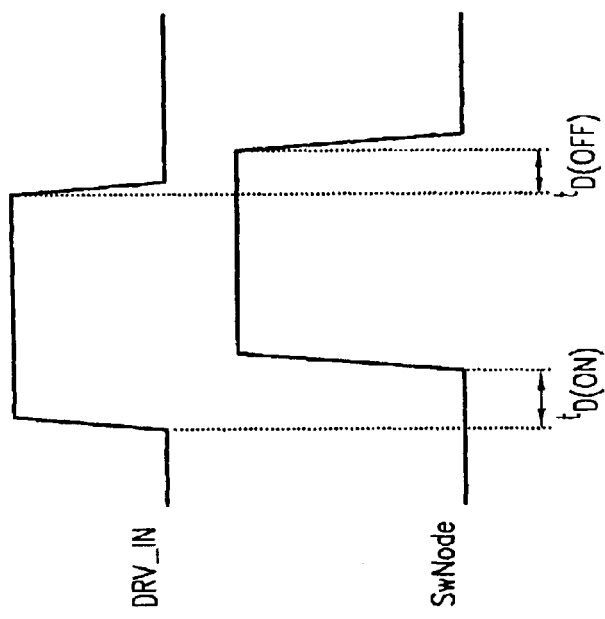
FIG. 4 is a timing diagram for an MCM according to the present invention.

Referring to FIG. 4, a timing diagram for MCM 2 is shown. A turn on delay $t_{D(ON)}$ of typically 63 ns exists between the signal input DRV_IN and output SW NODE of MCM 2. A turn off delay $t_{D(OFF)}$ of typically 26 ns exists between the signal input DRV_IN and output SW NODE of MCM 2. A portion of the delay is inherent in driver 12.

The supply voltage can range between 4.2 and 6.0 V. Input voltages of between 5 and 12 volts can be used, providing an output voltage range of 0.9–2.0 V. Output current is typically 15A. The device operates at frequencies from 300–1,000 kHz.

The operation of the circuit of FIG. 3 is considerably enhanced by the inherently close spacing between input capacitor C4 and MOSFET 10.

First, the removal of capacitor C4 from the mother board increases layout flexibility for the mother board.

Second, since the capacitor C4 is very close to MOSFETs 8 and 10, the stray inductance in the circuit is reduced in comparison to that which would be produced with C4 located outside the chip, on the mother board. This close location (about one centimeter or less) substantially reduces the "ring" in the circuit. More specifically, as shown in FIG. 3, MOSFET 10 has a parasitic capacitance $C_{OSS}$. The circuit including the stray inductance L and $C_{OSS}$ tends to ring at its resonant frequency. By reducing L, the ring is also reduced.

Figure 3A:
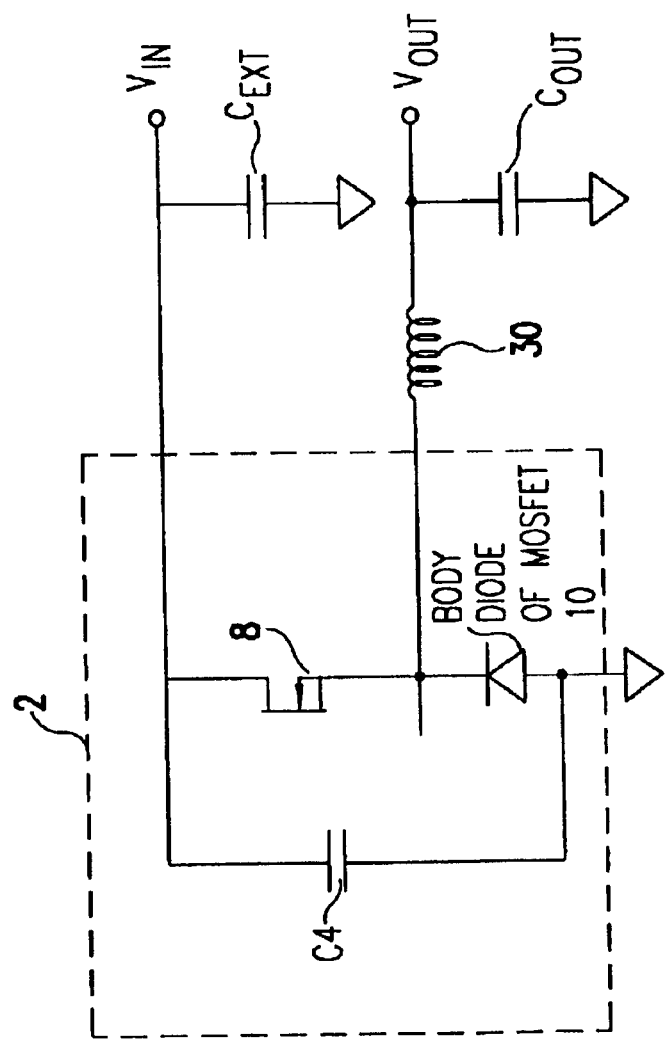
FIG. 3A is an equivalent circuit diagram of a portion of FIG. 3.

A third benefit of capacitor C4 is that it clamps $Q_{RR}$ (reverse recovery charge) of MOSFET 10 and keeps high di/dt from flowing out of module 2 and into the mother board. More specifically, FIG. 3A is an equivalent circuit of portions of FIG. 3 showing in particular the body diode of MOSFET 10. During the dead time, during which both MOSFETs 8 and 10 are off, conduction takes place through Schottky diodes 16 and 18 of FIG. 3, but some "residual" current also is conducted through the body diode of MOSFET 10. When MOSFET 8 turns on while the body diode of MOSFET 10 is conducting, a reverse recovery current will be fed from the external capacitor $C_{EXT}$ with very high di/dt. Capacitor C4, however, will act as a bypass to this high di/dt. The capacitor C4 of FIG. 3 serves similar purposes.

Although the present invention has been described in relation to particular embodiments thereof, many other variations and modifications and other uses will become apparent to those skilled in the art.

What is claimed is:

1. A multi-chip module (MCM) for providing power circuitry on a computer motherboard, comprising:
   a ball grid array (BGA) substrate having a first surface and a second opposing surface;
   two power MOSFETs disposed on the first surface of the BGA substrate and connected in a half-bridge arrangement between an input voltage and ground;
   a MOSFET gate driver disposed on the first surface of the BGA substrate and electrically connected to respective gate inputs of the two power MOSFETs for alternatively switching the power MOSFETs to generate an alternating output voltage at a common output node between the power MOSFETs; and
   at least one diode disposed on the first surface of the BGA substrate and connected between the common output node and ground to minimize losses during deadtime connection periods; and
   an input capacitor disposed on the first surface of the BGA and connected between the input voltage and ground; wherein the input capacitor is located adjacent to, and spaced less than 1 cm from the first and second MOSFETs, and wherein the input capacitor and the first and second MOSFETs are positioned side-by-side.

2. The module of claim 1, further comprising another diode connected in parallel with the diode connected between the common output node and between the common output node and ground.

3. The module of claim 1, wherein the substrate has an area of about 1 cm by 1 cm or less.

4. The module of claim 1, which further includes an insulation housing enclosing the substrate, the MOSFETs, the gate driver and the at least one diode, the ball grid array being exposed through the bottom of the housing for mounting to a mother board.

5. A multichip module comprising:
   a substrate having a first surface and an opposing second surface;
   a power input connection;
   a ground connection;
   two power switching devices disposed on said first surface of said substrate and connected in series according to a half-bridge arrangement between said power input connection and said ground connection; and
   an input capacitor connected between said power input connection and said ground connection, wherein said input capacitor is disposed on said first surface of said substrate and spaced no more than one centimeter from said two power switching devices, and wherein said input capacitor and said power switching devices are positioned side-by-side.

6. A multichip module according to claim 5, wherein said power switching devices are MOSFETs.

7. A multichip module according to claim 5, wherein said substrate is a ball grid array.

8. A multichip module according to claim 5, wherein said half-bridge connection includes an output node located between said two power switching devices, and further comprising at least one Schottky diode connected between said output node and said ground connection.

9. A multichip module according to claim 8, further comprising another Schottky diode connected between said output node and said ground connection.

10. A multichip module according to claim 5, further comprising a controller disposed on said substrate for selective control of the operation of said two power switching devices.

11. A multichip module according to claim 5, wherein said multichip module is 1 cm by 1 cm or less.

12. A multichip module according to claim 5, wherein said input capacitor reduces the stray inductance to reduce the ringing due to resonance in said at least one of said two power switching devices.

13. A multichip module according to claim 5, wherein said input capacitor is disposed on said substrate and spaced no more than one centimeter from the low side power switching device in said half-bridge arrangement.

* * * * *